(12) United States Patent
Chudley et al.

(10) Patent No.: US 9,975,051 B2
(45) Date of Patent: *May 22, 2018

(54) SOCIAL NETWORK SYSTEM AND METHOD FOR USE WITH AND INTEGRATION INTO A VIDEO GAME

(71) Applicant: ACTIVISION PUBLISHING, INC., Santa Monica, CA (US)

(72) Inventors: Martyn Richard Chudley, Knutsford (GB); Craig Howard, Manchester (GB); Paul Kerby, Lancashire (GB); Gareth George Wilson, Knutsford (GB); Gerard-Lee Talbot, Liverpool (GB); Ben James Ward, Liverpool (GB)

(73) Assignee: ACTIVISION PUBLISHING, INC., Santa Monica, CA (US)

( * ) Notice: Subject to any disclaimer, the term of this patent is extended or adjusted under 35 U.S.C. 154(b) by 172 days.

This patent is subject to a terminal disclaimer.

(21) Appl. No.: 14/570,054

(22) Filed: Dec. 15, 2014

(65) Prior Publication Data

US 2015/0352448 A1 Dec. 10, 2015
US 2016/0166939 A9 Jun. 16, 2016

Related U.S. Application Data

(63) Continuation of application No. 13/868,013, filed on Apr. 22, 2013, now Pat. No. 8,911,296, which is a
(Continued)

(51) Int. Cl.
*A63F 9/24* (2006.01)
*A63F 13/825* (2014.01)
(Continued)

(52) U.S. Cl.
CPC ............ *A63F 13/825* (2014.09); *A63F 13/35* (2014.09); *A63F 13/54* (2014.09); *A63F 13/55* (2014.09);
(Continued)

(58) Field of Classification Search
CPC .......... A63F 13/12; A63F 13/35; A63F 13/55; A63F 13/825; A63F 13/87
(Continued)

(56) References Cited

U.S. PATENT DOCUMENTS 5,890,964 A * 4/1999 Aoki ...................... A63F 13/10
463/44
7,249,123 B2 * 7/2007 Elder ...................... G06Q 10/10
(Continued)

OTHER PUBLICATIONS

U.S. Appl. No. 61/049,458, provisional application to Adoni et al. PG pub 2011/0107239, dated May 1, 2008.*

*Primary Examiner* — Michael Cuff
(74) *Attorney, Agent, or Firm* — Novel IP (57) ABSTRACT

A centralized social network tool is configured to interface with and integrates into one or more videogames and/or videogame series. The social network tool may be integral to the theme of the games and be pervasive within game play. The social network may drive progression of the story and interaction between characters. According to another aspect of the invention, the members of the social network may include actual members (corresponding to real people) and virtual members (e.g., artificial intelligence controlled bot members). The virtual members may be part of the social network and may interact with real members within and outside of the game as part of the theme of the game.

21 Claims, 2 Drawing Sheets

Related U.S. Application Data continuation of application No. 12/390,272, filed on Feb. 20, 2009, now Pat. No. 8,425,326.

(51) Int. Cl.
| | | |
|---|---|---|
| *A63F 13/35* | (2014.01) | |
| *G06F 17/50* | (2006.01) | |
| *A63F 13/795* | (2014.01) | |
| *A63F 13/54* | (2014.01) | |
| *G06F 3/048* | (2013.01) | |
| *A63F 13/55* | (2014.01) | |
| *A63F 13/87* | (2014.01) | |

(52) U.S. Cl.
CPC ............ *A63F 13/795* (2014.09); *A63F 13/87* (2014.09); *G06F 3/048* (2013.01); *G06F 17/5009* (2013.01); *A63F 2300/572* (2013.01)

(58) Field of Classification Search
USPC .......................................................... 463/42
See application file for complete search history.

(56) References Cited

U.S. PATENT DOCUMENTS

| | | | |
|---|---|---|---|
| 8,126,985 B1* | 2/2012 | Kandekar | A63F 13/77 345/418 |
| 8,425,326 B2 | 4/2013 | Chudley et al. | 463/42 |
| 8,911,296 B2 | 12/2014 | Chudley et al. | 463/42 |
| 2002/0131565 A1* | 9/2002 | Scheuring | G06Q 10/109 379/88.19 |
| 2004/0143852 A1 | 7/2004 | Meyers | 725/133 |
| 2007/0111774 A1* | 5/2007 | Okada | A63F 13/08 463/16 |
| 2008/0160877 A1* | 7/2008 | Lipman | A63H 3/28 446/268 |
| 2009/0265604 A1* | 10/2009 | Howard | G06Q 10/10 715/205 |
| 2010/0216553 A1* | 8/2010 | Chudley | A63F 13/55 463/42 |
| 2010/0229108 A1 | 9/2010 | Gerson et al. | 715/757 |
| 2011/0107239 A1 | 5/2011 | Adoni et al. | 715/757 |
| 2013/0237325 A1 | 9/2013 | Chudley et al. | 463/42 |

\* cited by examiner

FIG. 1

| From which character? | When is it sent? | Message example |
|---|---|---|
| UK Boss | More than 20 races in Hackney in the last 2 days. | "The boys tell me you've been hanging abound Hackney a lot recently. Good job lad, I like your enthusiasm. See you around" |
| UK Boss | No races in Hackney in the last two months. | "Oi oi, where have you got to then? Haven't seen you around Hackney in ages. Scared of a little competition? Get your ass over here; bring your motor and a pair of balls." |
| NY minor | When a friend posts a photo of you in New York Dumbo. | "What's up rookie? Guess what? You're famous! Your buddy [friend's name] just tagged you in a shot in Dumbo. Check it out!" |
| Buddy | Player has never taken a photo, but his/her profile is 1 month old. | "Hey bud, what's going down? You seen all those crazy photos the racin' crowd have been taking? There are some real beauties in there... maybe we should get in on that? You know you can take photos right?" |
| Buddy | Player has never taken a photo, but his/her profile is 2 months old. | "If you want to take a photo, just hit the start button and pick "Photo Mode". It's all pretty self-explanatory from there. I wanna see some of your shots man, get snappin'!" |
| LA nemesis | When a friend beats your lap record at the LA Docks. | "Yo chump. Looks like I was right all along... even [friend's name], a.k.a. "the big loser", has beaten your lap time at the Docks. It's embarrassing, it really is." |
| Buddy | When 10 or more people have replied to your thread on a group's wall. | "Dude, you seen this? Looks like you started a riot over at [group name]..." |
| UK minor | Raced every track in the UK (Blackpool and Hackney at least once. | "Alright mate. Looks like you've seen all there is to see in the UK now. Mind you, just 'cos you've raced every circuit, doesn't mean you're the dogs yet..." |
| UK minor | Raced every track in the UK (Blackpool and Hackney) at least 10 times. | "Bloody 'ell, you're really putting the time in at Blackpool and Hackney. I take it you must like our little island then? At any rate, you've got the local chavs in a frenzy. Good effort." |
| Tokyo minor | Player become top of his friends leaderboard for the first time. | "Wow! Great job! Out of all your friends you are the fastest in Tokyo! Check out the leaderboard..." |
| Tokyo minor | Player becomes last in his friends leaderboard for the first time. | "Weak. Out of all of your friends, you are the least skilled racer in Tokyo. Maybe you should put some practice in at our raceways, huh?" |
| Barcelona boss | Drastic improvement in Barcelona leaderboard position. | "I'm told that your skills are improving in Barcelona. It's excellent to see some real racers in my city... just make sure you show some of these other layabouts how it's done." |

FIG. 2

SOCIAL NETWORK SYSTEM AND METHOD FOR USE WITH AND INTEGRATION INTO A VIDEO GAME

CROSS-REFERENCE TO RELATED APPLICATIONS

This application is a continuation of U.S. patent application Ser. No. 13/868,013, filed on Apr. 22, 2013 (status: pending), which is a continuation of U.S. patent application Ser. No. 12/390,272, filed on Feb. 20, 2009 (which issued as U.S. Pat. No. 8,425,326 on Apr. 23, 2013), each of which is hereby incorporated by reference herein in its entirety.

FIELD OF THE INVENTION

The invention relates to an online social network that interfaces with and integrates into one or more video game and/or video game series and uses virtual member s to interact with real members within and outside of the game, where such interaction relates to at least part of the theme and progression of the game.

BACKGROUND OF THE INVENTION

Various videogames are known. Social networks in general are known. Some social networks include communication about a game.

SUMMARY

One aspect of the invention relates to a centralized social network tool that interfaces with and integrates into one or more videogames and/or videogame series. The social network tool may be integral to the theme of the games and be pervasive within game play. The social network may drive progression of the story and interaction between characters. According to another aspect of the invention, the members of the social network may include actual members (corresponding to real people) and virtual members (e.g., artificial intelligence controlled bot members). The virtual members may be part of the social network and may interact with real members within and outside of the game as part of the theme of the game.

By way of example, interaction between a real and a virtual member within the game may dynamically and adaptively impact interactions between the real and virtual member outside of the game (e.g., actions in game impact interactions via chat outside game, postings on member pages within the social network, membership and/or status within social network groups) and vice versa. For example, postings to member pages within the social network (or responses to such postings) outside the game may impact interaction within the game (e.g., challenging or hostile postings or responses by the real member may lead to an in-game challenge or aggressive behavior by the virtual member with respect to the real member during game play). Thus, the virtual member's personality and/or disposition toward a particular real member may vary based on interactions in game and out. This attitude/disposition may be dynamic and adaptive e.g., it can change over time based on different interactions. Additionally, a given virtual member may have different attitudes and/or dispositions to different real members, based on the specific interactions between the virtual member and the different individual real members. For example, individual virtual member behaviors toward a real member can be switched on or off based on an overarching disposition mode dynamically assigned to the relationship between the virtual member and the real member. Non-limiting examples of the possible overarching disposition modes including friend, rival, and/or neutral.

The virtual member may be programmed to be able to take different actions and/or perform various different in game moves with respect to a given real member player. The likelihood of a virtual member performing of these moves will be determined by its character setup, with some character features in the character set up being switched on or off depending on their relationship to the given real member player. In some instances, the status of the relationship between the virtual member and the given real member may be conveyed to the given real member. The status may be conveyed to the given member, for example, via a visual and/or audio indicator provided to the given real member in the game, via a visual and/or audio indicator provided to the given real member within the social network, and/or otherwise conveyed to the given member.

Relationships between real members and virtual members may impact the way the performance of real members in the game is evaluated and/or scored. For example, performance of certain skills (e.g., driving maneuvers) with respect to other participants (e.g., blocking, drafting, forcing into a crash, and/or other maneuvers) may be executed by real members during the game to earn experience points. Depending on the relationship between a real member and the virtual member(s) involved in a maneuver executed by the real member, the real member may receive more or less experience points. By way of non-limiting example, if the skill performed by the real member is detrimental to a virtual member that is a rival, the real member may receive more experience points than for performing the same skill with respect to a virtual member that is neutral toward the real member.

A relationship between a virtual member and a real member may be impacted by other relationships of the virtual member and the real member. For example, if the virtual member and the real member are both friends of another member, the virtual member may be more inclined to have a positive attitude or disposition toward the real member both in game and in out of game interactions. If the relationship between the real member other member becomes adversarial, then the friend relationship between the virtual member and the real member may become more tenuous, or even fall to neutral or worse. The other member may be a virtual member or a real member. As such, the in game and/or out of game interactions of one real user with a virtual member may impact the relationship of other real users with the same virtual member.

According to another aspect of the invention, there may be various virtual member types. The types may include, for example, primary virtual members, secondary virtual members, extra virtual members, and/or other types of virtual members. For example, primary virtual members may play more central roles within in the game. The type of a given virtual member may impact the types and/or manner of interaction that the given virtual member can have with real members in and/or out of the game (e.g., in game chat, social network page posts, issue of challenges, acceptance of challenges, offering and/or accepting group membership, and/or other interaction).

By way of non-limiting example, a primary virtual member may be a leader of a group or gang of other virtual and/or real members within the game. A primary virtual member may be "boss" that must be defeated in order to unlock additional game content (e.g., move on to a new level, racetrack, battleground, challenge). A primary virtual member may be a character within the game that disseminates information. The information may include information about the progress and/or achievements of other members (real and/or virtual), quests to be completed, and/or other information.

A secondary virtual member may be a competitor with real members that does not present any extraordinary challenge. A secondary virtual member may be a character within the game that provides support or assistance to real members (e.g., a mechanic, a parts or car vendor).

An extra virtual member may be a non-player character that provides ambiance or context to the game, but does not contribute in a substantive manner to the experience. For example, spectators of a race, fight, or sporting event may be extra virtual members.

According to one embodiment of the invention, a system may include at least one game platform, a user profile module, a social network module, a virtual member management module, a game module, an external application input module, and/or other modules or components.

The game platform can include one or more of a game console, a personal computer, a mobile game platform, a handheld device, a mobile communications device, and/or other game platforms.

The user profile module may be configured to store and/or manage user information about one or more users that play the game and/or interact with the social network. The user information may include an identity of a user (e.g., a username, a gamertag, and/or other identities), demographic information associated with the user, real members of the game and/or social network associated with the user, and/or other information associated with the user. The user profile module may be configured to ensure that access to the game and/or the social network as a given user and/or a real member associated with the given user is secure (e.g., password protected).

The social network module may include a member page module, a communications module, a challenge module, an achievement module, a group module, and/or other modules. The social network module may be configured to provide the social network the is integrated with the game(s), and enables real and virtual members to interact therein. The social network provided by the social network module may be provided to real and/or virtual members that take part in the game(s) on different types of gaming platform (e.g., Xbox, PlayStation, Nintendo Wii, PC, Apple, mobile communications device, handheld device, and/or other platforms). Users implementing different platforms may not be able to participate in the actual game with each other (e.g., during a multiplayer session). However, the social network may provide a unitary forum in which the users of platforms that are incompatible for game play can socialize, compete, trade, and/or otherwise interact in the context of the game(s).

The member page module may be configured to manage, organize, and/or maintain member pages that correspond to individual members (virtual and/or real). A member page may include information related to the corresponding member. The member page may be a virtual "home" for the corresponding member in the social network, and may be customized with content and/or information chosen by the member. The member page may be accessible to one or more other members. Access to the member page by the one or more other members may enable the other members to add or modify content or information on the user page (e.g., to communicate with the member corresponding to the member page). Member pages may be hosted on a network and may be accessed, for example, on a gaming platform or via a browser being executed on a different processing platform.

As used herein the term "member page" is not limited to a single view or interface (e.g., a single web page). A member page may include several separate views and/or areas, some of which may be kept more or less private from other members that other views and/or areas. For example, a member page may include a profile view that includes content and information related to the competition results, game progress, group memberships, invitations, events attended, scheduled events, friends, possessions (e.g., cars), public messages to and/or from the member, challenges accepted, challenges completed, and/or other information associated with the member. A member page may include a private message view that enables a member to access and manage private messages sent to and from other members. A member page may include a view that provides the member with updates about the activities of the member, other members, and/or other events in game or out of game. A member page may include other views and/or areas that include other types of content and/or information related to the in game and/or out of game activities of the member. Member pages may be provided and maintained in the social network for both real members and virtual members. Virtual members may access and/or contribute to the member pages of real members, and vice versa.

The communications module of the social network may include a multi-mode communication tool (e.g., email, text, chat, in-game communication (voice and/or text), exportation to the Web) for communicating results, invites, challenges, events, locales, new features of game/sequels. As such, the communication module may provide communication to members by updates and/or messages to member pages. The communication module may communicate with members via other communication media. For example, updates and/or messages posted to a member page may result in notifications of these updates and/or messages being transmitted to an email account, SMS capable device, a voicemail box, and/or other electronic communication accounts or devices associated with the member page.

The communications module may disseminate information within the game and/or outside the game regarding the progression of an individual or groups within the game. For example, the communications module may broadcast to some or all members in-game activity (e.g., achievements, changes, challenges, and other activities), which may lead to interaction outside the game (chat, challenges, member page postings, public messages, private messages, and/or other interactions), which in turn may lead to new activity in the game (e.g., a game between the real and/or virtual member s who engaged in the interaction outside the game.

The challenge module may enable members to define and disseminate challenges. A challenge may include one or more in-game tasks that are specifically defined by a member. By way of non-limiting example, the tasks may include stunts, crashes, races, race results (e.g., finishing place), adversaries, and/or other tasks performed in-game. A challenge may dictate restrictions or self-imposed handicaps that must be employed during performance (e.g., no use of nitrous). The challenge module may enable a member to selectively disseminate a created challenge to one or more specific other members or groups of members, or globally to any members.

As was mentioned above, challenges may be disseminated by a virtual member to a real member, or vice versa. Challenges transmitted from a virtual member to a real member may be impacted by the attitude and/or disposition of the virtual member toward the real member. For example, if the virtual member and the real member are friends, the virtual member may send more and/or easier challenges to the real member. If the virtual member and the real member are rivals, the virtual member may send fewer and/or more difficult challenges to the real member.

The challenge module may track the status of individual members with respect to the challenges they have received and accepted. Tracking the status of individual members with respect to the challenges they have received and accepted may include comparing the in-game activities of individual members with the parameters of their accepted challenges. Upon determining that a member has performed a challenge, the challenge module may generate a notification. The notification may be added to the member page of the member that performed the challenge, and/or disseminated to other members (e.g., the member that created the challenge, other members that have accepted the challenge, friends of the member that performed the challenge). The notification may be disseminated to other members by the communication module.

The achievement module may be configured to track the achievements of members in the game and/or out of the game. The achievements of members in the game may include game results, and may indicate which of the members has performed "better" within the game. For example, the achievement module may track the finish times at individual race tracks, lap times, top five finishes, wins, crashes, stunts, accumulated points, vehicles owned, number of friends, number of rivals, and/or other activities. The achievement module may establish rankings based on the activities tracked. The rankings may include rankings based on individual activities (e.g., race times at a single track), and/or rankings based on a set of activities. The rankings may be accessible to members via the social network, on a separate website, via a gaming console, and/or other types of real time or near real time communication.

The achievement module may establish rankings for a predetermined set of members. For example, a group of members set up on the social network may have its own rankings for specified activities. The achievement module may establish global rankings that encompass substantially all of the members taking part in the game(s).

The group module may be configured to manage member groups within the social network. Groups may include sets of members that have a dedicated space within the virtual network for posting content and/or communications. These spaces may be private (e.g., only open to members who are a part of the group) or public. Groups membership in a given group may be reflected in the member pages of the members that are a part of the given group.

Groups may be established by members. In establishing a group, a member may provide a name for the group, set criteria for joining the group, set criteria for remaining a part of the group, and/or otherwise define the group. Criteria for joining and/or remaining a part of the group may include in-game activities (e.g., win a certain race, achieve a certain lap time, crash a specified number of times, and/or other activities), activity within the group (e.g., posting to the group page, issuing challenges to the group, performing challenges issued by the group), ownership of virtual items (e.g., ownership of a certain type of car), and/or other criteria. Groups can be established by real members and by virtual members.

In some groups, in order to become a part of the group a member must receive an invitation. The invitation may be in place of, or in addition to, satisfying the criteria for joining. Upon reception of an invitation, a member may accept an invitation and join the designated group, or reject the invitation. Group invitations may be sent from virtual members to real members, or vice versa.

Actions of real members with respect to groups may impact the relationships of the real members with virtual members. For example, if a real member rejects the invitation of a group, the attitudes and/or dispositions toward the rejecting real member of virtual members that are a part of the group may be negatively impacted. If a virtual member sent the rejected invitation to the real member, the attitude and/or disposition of the virtual member to the real member may be especially negatively impacted. As another example, if a real member invites a virtual member to join a group, the attitude and/or disposition of the virtual member toward the real member may be positively impacted.

Membership and/or status within a group in the social network may be linked with progression through the game. For example, satisfying the criteria required to join a group and/or obtaining an invitation to join the group may unlock content within the game. The new content may include, for instance, a new race, a new locale, new virtual members to compete against, a new level, and/or other game content.

Points and/or status within the game may be achieved through participation in the social network. For example, experience points, virtual currency, and/or other incentives may be provided to real members for posting content to the social network, creating and/or joining groups, filling in profile information, creating friendships, rating content posted by others, and/or other activities on the social network. As such, a real member may begin to accrue points and/or status within the game prior to owning or even playing the actual game.

Returning to the components of the overall system, the virtual member management module may be configured to manage the virtual members that participate in the game and/or the social network. The virtual member management module may include a virtual member character set up module, a virtual member game control module, and a virtual member social network control module.

The virtual member character set up module may determine the attitude and/or disposition of individual virtual members to individual real members. The attitude and/or disposition of individual virtual members to individual real members may be based on interactions in the game and in the social network between the individual real members and the individual real members. The virtual member character set up module may track the interactions between a given real member and a given real member (and/or other interactions involving these members), and may determine an attitude of the given virtual member toward the given real member based on the friendliness or enmity of these interactions. In some implementations, an overarching disposition mode is assigned to the relationship between the given real member and the given virtual member based on their interactions. Non-limiting examples of the possible overarching disposition modes including friend, rival, and/or neutral. Individual virtual member behaviors toward the given real member by the given virtual member can be switched on or off based on the assigned disposition mode.

The virtual member game control module may be configured to control the virtual members in the game. The virtual member game control module may alter the manner in which the virtual members are control based on the attitudes and/or dispositions determined by the virtual member character set up module.

The virtual member social network control module may be configured to control the interactions of the virtual members in the social network. The virtual member social network control module may alter the manner in which the virtual members interact with real members on the social network based on the attitudes and/or dispositions determined by the virtual member character set up module.

The game module may include any one or more software-based videogame and/or a series of games.

The external application input module may enable inputs to be received to the social network from external information sources, such as external applications, external data stores, external web applications and/or other external information sources. This information may be reflected on the social network (e.g., within one or more member pages and/or one or more group spaces). The information received from the external information sources through the external application input module may be reflected in the game provided to real players. By way of example, weather reports may be received from an external source (e.g., a weather related website), and the information within the weather report may be reflected in the social network. The updated weather information reflected in the social network may then be implemented by one or more of the modules being executed by the game platform to determine the weather present at one or more events in the game (e.g., at one or more racetracks).

According to another aspect of the invention, the interaction between a real and virtual member is part of the theme of the game. For example, in the context of a racing game, real and virtual members can engage in chat outside of the game which can lead to a challenge within the game. Thus, the virtual member can become a player within the game and interact with the real member who may also play.

According to another aspect of the invention, the story and/or progression of the game for a given real member are impacted by the interactions that the given real member has with virtual members both in the game and on the social network. For example, new locations and story elements may become available in the game as real member makes friends and rivals with the various virtual members. The relationships of the real member are dynamically developed into friendships and/or rivalries based on the actions of the real member toward the virtual members in the game, and the interactions of the real member with the virtual members on the social network.

According to another aspect of the invention, the social network module provides a cross-platform Social Network for one or more game titles with communication across different game platforms, game titles and/or game series. For example, the user profiles can be used with the same game title across multiple platforms, within a series of games (e.g., persistent across different titles in the same series), across game series and/or with different game titles (e.g., persistent across different titles in different series). This may produce loyalty among users to the games and/or platforms that are supported by the social network. Users that build their profiles, and/or a mass rewards, status, points and/or virtual currency via games that are supported by the social network may be hesitant to migrate to new games outside of the social network where they may have to "start fresh."

The system can use the social network to preview, in a variety of ways, enhancements, sequels, new games in the series and/or other games or content. By way of example, the system may provide content about the new offering (e.g, to provide a preview or trailer video to deliver a 'coming soon' message into the player's news feed, that could show them a video trailer of the new offering). As another example, the system can use virtual member messages (e.g., a virtual member can send one or more player messages about upcoming features in the new offering). As another example, the system can send screenshots of the new offering (e.g, a virtual member can send a player screenshots of new content in the new offering), preview parts of new version for free in current version (trailer, video virtual member messages, screen shots, etc.), and/or provide new content to players in other ways.

Characters in an upcoming game may be introduced as new virtual members to the social network. The new virtual members create new relationships with real member through member messages, joining groups, accepting challenges and/or friendships, starting new groups, issuing new challenges, and/or other interactions on the social network. In some instances, previously existing virtual members may suddenly become less prevalent in existing games, as they "visit" the content of an upcoming game. They may report back the real members of the social network about the upcoming content through member page postings, member messages, and/or other types of interactions.

The social network may be leveraged to obtain user feedback concerning upcoming content and/or games. Content postings, member messages, and/or other interactions of virtual members conveying information about upcoming content may be monitored to gauge the reaction of real members on the social network. These reactions may be used to make decisions about the design and/or execution of the yet to be released game content.

A player that has played previous games supported by the social network may enter a new game release with the status, relationships, equipment, and/or skills that he has acquired through game play in previous releases and/or involvement in the social network. As such, as new games become public, and are supported by the social network, previous involvement in the social network may encourage users to adopt the new releases. For example, players that have spent time playing the previous releases and building their profiles on the social network may be motivated to participate in the new releases to maintain their membership in groups on the social network with game play requirements for membership, to gain access to new user groups, to perform and/or design challenges in the new releases, to interact in game with friends and rivals that are participating in the new releases, and/or for other social reasons. As such, the social network builds brand loyalty amongst users by leveraging the time and energy that users have previously spent building their characters and the status of the characters within the context of the games.

The social network may support the development of third-party applications that are usable with the social network. The third-party applications may be subject to review by the provider of the social network.

For illustrative purposes only, an example of the use of the social network and virtual members in a racing game is discussed herein. However, the social network module and other features of the invention may be used with or in other types of games as well. According to one embodiment of the invention, the racing game may include one or more components involving a locale-based, event and group focused game with real and virtual members. Players may join groups and/or may increase their status within the groups in order to progress in the game. The game may be divided in several locales, each providing plurality of different races.

By competing in the various races to achieve results, perform challenges and/or defeat other characters, player may advance in the game.

The groups that players must join and/or advance in to progress within the game may be groups formed on the social network. By interacting with members of the social network and competing in races, members may be admitted to the groups and/or rise in status within the groups. Further, by teaming with virtual members and/or working against virtual members during races, players may form alliances and/or rivalries with virtual members that shape the manner in which the races unfold. In some instances, virtual members may provide guidance to real members via interactions in the social network regarding what the real members should do to advance in the game. This guidance may include information about future locales, groups that should be joined, race achievements that should be attained, sources or offers for sale of cars and/or parts that may facilitate advancement, and/or other guidance.

The system described may provide opportunities for enhanced targeted in-game sponsorship and/or advertising. For example, rather than only selling advertisement space within the game, advertising space may be sold in the social network. This may include banner ads in view of the social network. Further, demographic information, consumer preferences, and/or other information entered by users into the social network may be implemented to generated targeted advertising opportunities in the game and/or via the social network. For example, individual user information, group information, friendship information, communications between members, and/or other information from the social network may provide for targeted advertising opportunities. In some implementations, virtual members may endorse products or services. These endorsements may include virtual product usage (e.g., fastest virtual member drives a certain type of car), express statements in game, express statements in the social network, and/or other types of endorsements.

These and other objects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
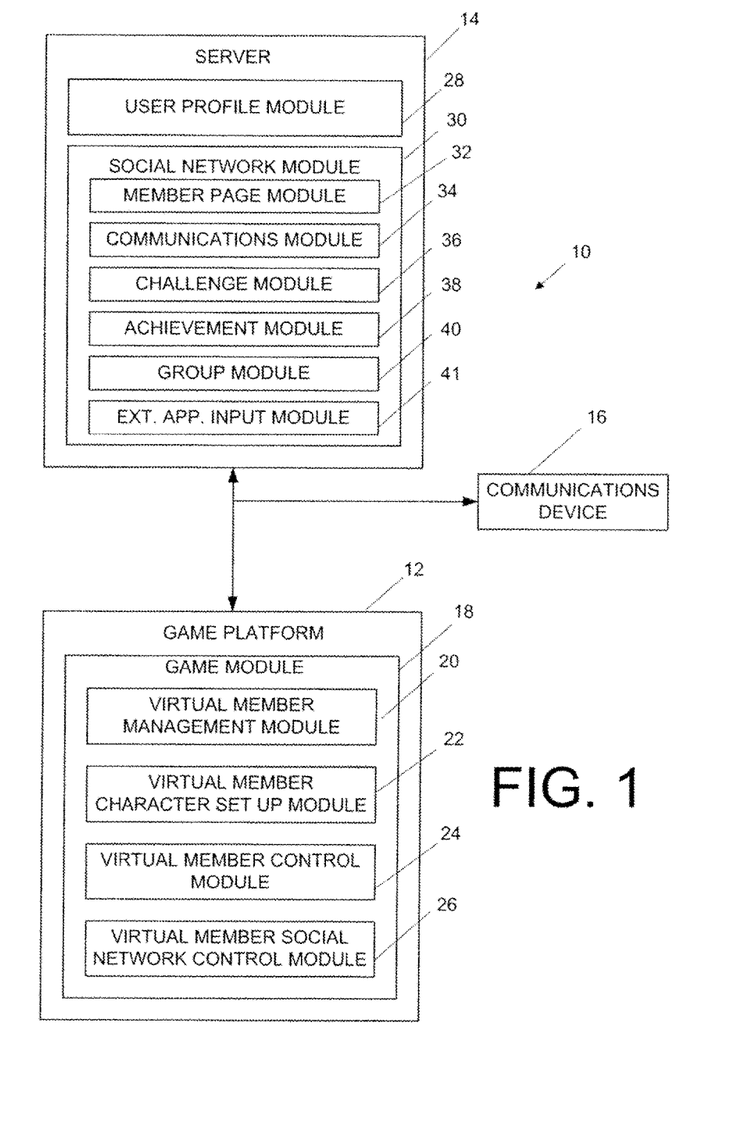
FIG. 1 illustrates a system configured to provide a social network tool that interfaces with and integrates into one or more videogames, in accordance with one or more implementations.

FIG. 1 illustrates a system 10 configured to provide a centralized social network tool that interfaces with and integrates into one or more videogames and/or videogame series. The social network tool may be integral to the theme of the games and be pervasive within game play. The social network may drive progression of the story and interaction between characters. The members of the social network may include actual members (corresponding to real people) and virtual members (e.g., artificial intelligence controlled bot members). The virtual members may be part of the social network and may interact with real members within and outside of the game as part of the theme of the game. The system 10 may include one or more game platforms 12, a server 14, one or more communication devices 16, and/or other components. Although some specific examples are given below describing the operation of the social network in connection with a vehicle racing game, these are given for illustrative purposes and are not intended to be limiting.

The game platforms 12 may include one or more of a game console, a personal computer, a mobile game platform and/or other game platforms. A given game platform 12 may include one or more processors, one or more electronic storage media, an electronic display, and/or other components that enable the given game platform 12 to execute one or more computer software programs that cause the given game platform 12 to provide a player with the gaming experience described herein. A user may input information to game platform 12 via one or more peripherals that interface with game platform 12. For example, the peripherals may include one or more of a game controller, a joystick, a direction pad, a button, a switch, a mouse, a trackball, a touch screen, a keyboard, and/or other peripheral input devices. By way of non-limiting example, game platform 12 may include one or more of an Xbox® game platform, a Sony PlayStation® game platform, a Nintendo Wii® game platform, a Nintendo DS® mobile game platform, a Sony PlayStation Portable® mobile game platform, a handheld device, a mobile communications device, and/or other game platforms.

The game platform 12 may execute one or more modules to provide the videogame and/or social network described herein to a player. The one or more modules may include a software module, a hardware module, a firmware module, and or one or more modules formed from a combination of software, hardware, and/or firmware. The one or more modules may include game module 18, virtual member management module 20, and/or other modules. It will be appreciated that the designation of various modules as performing certain functions herein is not intended to be limiting. The functions described within this disclosure may be performed by any combination of modules and/or by a variety of different configurations of processors and/or modules. For example, some of the modules and/or functionality attributed herein to game platform 12 may be provided by server 14, and vice versa.

The game module 18 may be configured to control game platform 12 to generate visual, audio, and/or tactile stimulus that provides a player with the game experience. For example, with respect to a game (or games) that involve racing vehicles, game module 18 may control game platform 12 to generate a display, sounds, and/or haptic feedback to the player that mimics the visual, audio, and/or tactile stimulus experienced during racing vehicles in real life. As such, game module 18 may include a physics engine, representations of one or more physical spaces (e.g., a plurality of racecourses), representations of one or more characters (e.g., a player representation or avatar corresponding to a player, representations of other characters in the game controlled by artificial intelligence and/or other players), and/or other information, instructions, and/or modules that generate the sensory stimulation associated with the videogame(s).

Within the both the social network and the videogame(s) provided by system 10, the player may interact with a plurality of other members. These members include real members that are controlled by real people, and virtual members that are controlled by artificial intelligence provided by system 10. The virtual member management module 20 may be configured to manage the virtual members that participate in the game and/or the social network. The virtual member management module 20 may include a virtual member character set up module 22, a virtual member game control module 24, a virtual member social network control module 26, and/or other modules.

The virtual member character set up module 22 may determine the attitude and/or disposition of individual virtual members to individual real members (e.g., the real member corresponding to the player playing the game(s) on game platform 12). The attitude and/or disposition of individual virtual members to individual real members may be based on interactions in the game and in the social network between the individual real members and the individual real members. The virtual member character set up module 22 may track the interactions between a given real member and a given real member (and/or other interactions involving these members), and may dynamically determine an attitude of the given virtual member toward the given real member based on the friendliness or enmity of these interactions. In some implementations, an overarching disposition mode is assigned by virtual member character set up module 22 to the relationship between the given real member and the given virtual member based on their interactions. Non-limiting examples of the possible overarching disposition modes including friend, rival, and/or neutral.

The status of relationships between the virtual members and a real member may be conveyed to the real member. The status may be conveyed to the real member, for example, via a visual and/or audio indicator provided to the real member in the game, via a visual and/or audio indicator provided to the real member within the social network, and/or otherwise conveyed to the real member.

The virtual member character set up module 22 may switch individual virtual member behaviors toward the given real member by the given virtual member on or off based on the assigned disposition mode and a predetermined profile established for the given virtual member. For instance, for a first disposition mode, the predetermined profile for the given virtual member may dictate that behaviors A, B, and C may be switched on while behaviors D, E, and F may be switched off. If virtual member character set up module 22 determines that the relationship between the given real member and the given virtual member has changed to a second disposition mode, the predetermined profile may dictate that one or more of behaviors A, B, and C be switched off and/or one or more behaviors D, E, and F be switched on.

Behaviors that may be switched on and/or off by virtual member character set up module 22 in accordance with predetermined profiles of virtual members may include on the racetrack moves that are intended to help or hinder real members. For example, such behaviors may include one or more of blocking, sideswiping, ramming from behind, braking with a real member behind, allowing a pass, drafting, allowing drafting, overtaking, and/or other behaviors.

Behaviors that may be switched on and/or off by virtual member character set up module 22 may include behaviors within the social network toward real members. For example, these behaviors may include inviting to join groups, accepting invitations to join groups, posting encouraging, positive, and/or helpful messages to member pages, posting discouraging, negative, and/or derisive messages to member pages, issuing challenges, accepting challenges, and/or other behaviors.

The virtual member game control module 24 may be configured to control the virtual members in the game. The virtual member game control module 24 may alter the manner in which the virtual members are control based on the attitudes and/or dispositions determined by the virtual member character set up module 22, and/or the behaviors switched on and/or off by virtual member character set up module 22.

The virtual member social network control module 26 may be configured to control the interactions of the virtual members in the social network. The virtual member social network control module 26 may alter the manner in which the virtual members interact with real members on the social network based on the attitudes and/or dispositions determined by the virtual member character set up module, and/or the behaviors switched on and/or off by virtual member character set up module 22.

As will be appreciated from the foregoing, virtual member management module 20 functions such that interaction between a real and a virtual member within the game may dynamically and adaptively impact interactions between the real and virtual member outside of the game (e.g., actions in game impact interactions via chat outside game, postings on member pages within the social network, membership and/or status within social network groups) and vice versa. For example, postings to member pages within the social network (or responses to such postings) outside the game may impact interaction within the game (e.g., challenging or hostile postings or responses by the real member may lead to an in-game challenge or aggressive behavior by the virtual member with respect to the real member during game play). Thus, the virtual member's personality and/or disposition toward a particular real member may vary based on interactions in game and out. This attitude/disposition may be dynamic and adaptive e.g., it can change over time based on different interactions.

Relationships between real members and virtual members may impact the way the performance of real members in the game is evaluated and/or scored. For example, performance of certain skills (e.g., driving maneuvers) with respect to other participants (e.g., blocking, drafting, forcing into a crash, and/or other maneuvers) may be executed by real members during the game to earn experience points. Depending on the relationship between a real member and the virtual member(s) involved in a maneuver executed by the real member, the real member may receive more or less experience points. By way of non-limiting example, if the skill performed by the real member is detrimental to a virtual member that is a rival, the real member may receive more experience points than for performing the same skill with respect to a virtual member that is neutral toward the real member.

A relationship between a virtual member and a real member may be impacted by other relationships of the virtual member and the real member. For example, if the virtual member and the real member are both friends of another member, the virtual member may be more inclined to have a positive attitude or disposition toward the real member both in game and in out of game interactions. If the relationship between the real member other member becomes adversarial, then the friend relationship between the virtual member and the real member may become more tenuous, or even fall to neutral or worse. The other member may be a virtual member or a real member. As such, the in game and/or out of game interactions of one real user with a virtual member may impact the relationship of other real users with the same virtual member.

Amongst the virtual members controlled by virtual member management module 20, there may be various virtual member types. The types may include, for example, primary virtual members, secondary virtual members, extra virtual members, and/or other types of virtual members. For example, primary virtual members may play more central roles within in the game. The type of a given virtual member may impact the types and/or manner of interaction that the given virtual member can have with real members in and/or out of the game (e.g., in game chat, social network page posts, issue of challenges, acceptance of challenges, offering and/or accepting group membership, and/or other interaction).

By way of non-limiting example, a primary virtual member may be a leader of a group or gang of other virtual and/or real members within the game. A primary virtual member may be "boss" that must be defeated in order to unlock additional game content (e.g., move on to a new level, racetrack, battleground, challenge). A primary virtual member may be a character within the game that disseminates information. The information may include information about the progress and/or achievements of other members (real and/or virtual), quests to be completed, and/or other information.

A secondary virtual member may be a competitor with real members that does not present any extraordinary challenge. A secondary virtual member may be a character within the game that provides support or assistance to real members (e.g., a mechanic, a parts or car vendor).

An extra virtual member may be a non-player character that provides ambiance or context to the game, but does not contribute in a substantive manner to the experience. For example, spectators of a race, fight, or sporting event may be extra virtual members.

Figure 2:
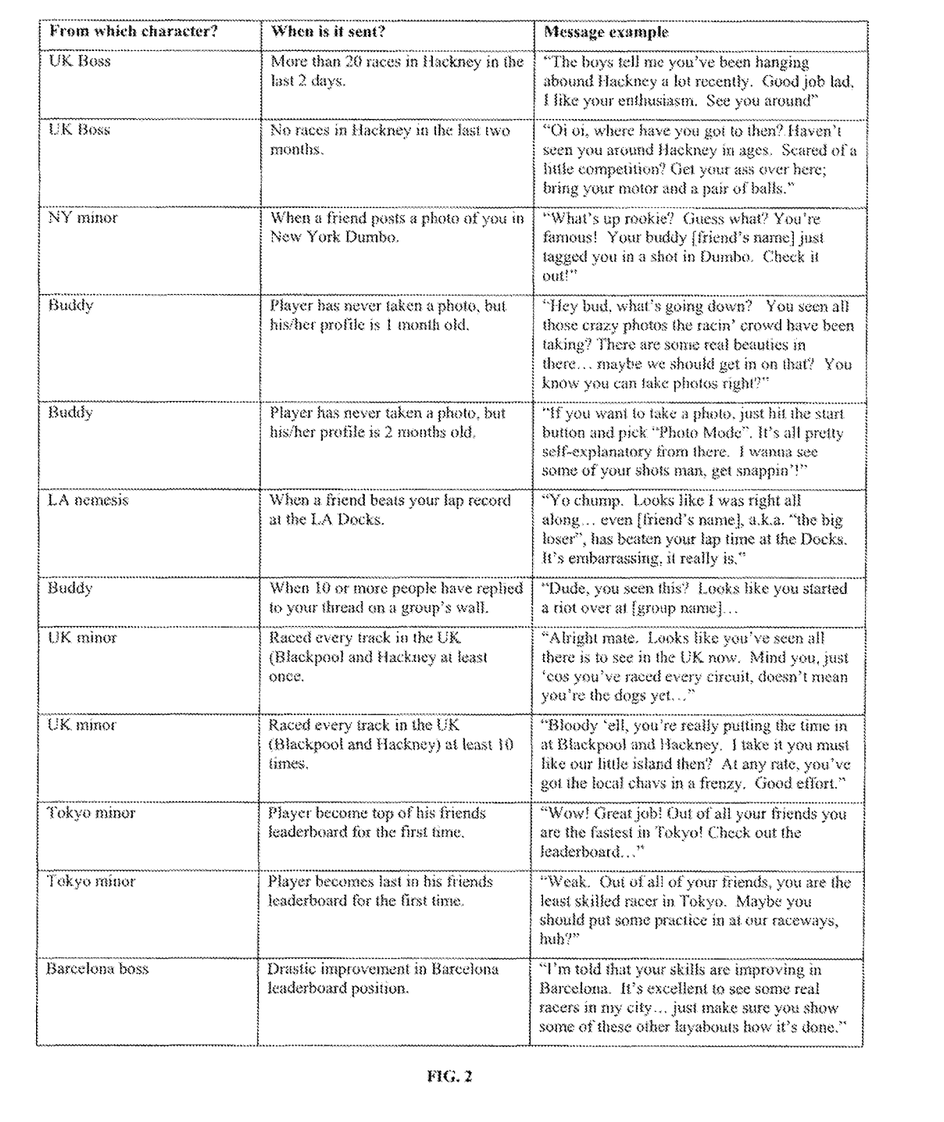
FIG. 2 provides a table of examples of messages that may be sent from artificial intelligence controlled virtual members of a social network to real members of the network, according to one or more implementations.

By controlling interactions of virtual members with real members on the social network, virtual member management module 20 may implement the virtual members to provide guidance within the game(s), prompt the real members to participate in the game(s) and/or the social network in ways that are desirable to the game/network provider, inform the real members of the accomplishments of their real and/or virtual friends, and/or provide a forum for other automated communication between the game(s) and the players. By controlling interactions between virtual members with real members in this manner, communications between virtual members and the real members may be impacted by the relationships between the virtual members, relationships between the real members and other real members, membership of the real members within groups, social network participation, and/or other factors. By way of non-limiting example, FIG. 2 presents a table of different social network communications that may be sent from virtual members to a real member, and the impetus for these messages being transmitted.

Returning to FIG. 1, the server 14 may manage the communication of information between players, virtual members, game platforms 12, and/or other entities participating in system 10. For example, server 14 may manage the communication of data between game modules 18 to enable players to participate in the game by competing in the same races or other events simultaneously. Server 14 may manage the transmission of communications data between game platform 12 to enable players of the game(s). This communications data may include text communications, voice communications, and/or video communications. Server 14 may manage communication between players and/or virtual members by hosting the social network.

Server 14 may include one or more processors executing one or more modules to provide the videogame and/or social network described herein to a player. The server 14 may include one or more devices co-located providing the functions described herein, or server 14 may include a plurality of different devices that are located remotely from each other that cooperate to provide the described functionality. The one or more modules may include a software module, a hardware module, a firmware module, and or one or more modules formed from a combination of software, hardware, and/or firmware. The one or more modules may include a user profile module 28, a social network module 30, and/or other modules. It will be appreciated that the designation of various modules as performing certain functions herein is not intended to be limiting. The functions described within this disclosure may be performed by any combination of modules and/or by a variety of different configurations of processors and/or modules. For example, some of the modules and/or functionality attributed herein to server 14 may be provided by game platform 12, and vice versa.

The user profile module 28 may be configured to store and/or manage user information about one or more users that play the game and/or interact with the social network. The user information may include an identity of a user (e.g., a username, a gamertag, and/or other identities), demographic information associated with the user, real members of the game and/or social network associated with the user, and/or other information associated with the user. The user profile module 28 may be configured to ensure that access to the game and/or the social network as a given user and/or a real member associated with the given user is secure (e.g., password protected).

The social network module 30 may be configured to provide the social network that is integrated with the game(s), and enables real and virtual members to interact therein. The social network provided by the social network module 30 may be provided to real and/or virtual members that take part in the game(s) on different types of gaming platform (e.g., Xbox, PlayStation, Nintendo Wii, PC, Apple, and/or other platforms). Users implementing different platforms may not be able to participate in the actual game with each other (e.g., during a multiplayer session). However, the social network may provide a unitary forum in which the users of platforms that are incompatible for game play can socialize, compete, trade, and/or otherwise interact in the context of the game(s). The social network module 30 may include a member page module 32, a communications module 34, a challenge module 36, an achievement module 38, a group module 40, external application input module 41, and/or other modules.

The member page module 32 may be configured to manage, organize, and/or maintain member pages that correspond to individual members (virtual and/or real). A member page may include information related to the corresponding member. The member page may be a virtual "home" for the corresponding member in the social network, and may be customized with content and/or information chosen by the member. The member page may be accessible to one or more other members. Access to the member page by the one or more other members may enable the other members to add or modify content or information on the user page (e.g., to communicate with the member corresponding to the member page). Member pages may be hosted on a network and may be accessed, for example, on gaming platform 12 or via a browser being executed on a different processing platform (e.g., communication devices 16).

The information on a member page for a given member may include information added, or posted, to the member page by the member, information automatically added to the member page, information that is updated automatically on the member page, information that is provided by other members, and/or information from other sources. The information on the member page may include biographic information about the member and/or the player corresponding to the member, pictures, videos, screenshots, machinima, information related to progress or achievements of the member in the game, messages from other members, information related to groups that the member belongs to, ratings of other content on the social network, ratings of the content on the member page provided by other members, and/or other information.

As used herein the term "member page" is not limited to a single view or interface (e.g., a single web page). A member page may include several separate views and/or areas, some of which may be kept more or less private from other members that other views and/or areas. For example, a member page may include a profile view that includes content and information related to the competition results, game progress, group memberships, invitations, events attended, scheduled events, friends, possessions (e.g., cars), public messages to and/or from the member, challenges accepted, challenges completed, and/or other information associated with the member. A member page may include a private message view that enables a member to access and manage private messages sent to and from other members. A member page may include a view that provides the member with updates about the activities of the member, other members, and/or other events in game or out of game. A member page may include other views and/or areas that include other types of content and/or information related to the in game and/or out of game activities of the member. Member pages may be provided and maintained in the social network for both real members and virtual members. Virtual members may access and/or contribute to the member pages of real members, and vice versa.

The communications module 34 of the social network may include a multi-mode communication tool (e.g., email, text, chat, in-game communication (voice and/or text), exportation to the Web) for communicating results, invites, challenges, events, locales, new features of game/sequels. As such, the communication module 34 may provide communication to members by updates and/or messages to member pages. The communication module may communicate with members via other communication media. For example, updates and/or messages posted to a member page may result in notifications of these updates and/or messages being transmitted to one or more of communication devices 16 (e.g., an email to an email account accessible by communication device 16, an SMS text to communication device 16) associated with the member page.

The communications module 34 may disseminate information within the game and/or outside the game regarding the progression of an individual or groups within the game. For example, the communications module 34 may broadcast to some or all members information related to in-game activity (e.g., achievements, changes, challenges, and other activities), which may lead to interaction outside the game (chat, challenges, member page postings, public messages, private messages, and/or other interactions), which in turn may lead to new activity in the game (e.g., a game between the real and/or virtual member s who engaged in the interaction outside the game. At least some of the communications communicated by communications module 34 regarding in-game activity may be in the form of communications from virtual members to real members that informs the real members of the progress and/or performance of other virtual members and/or real members (e.g., as described above, and illustrated in FIG. 2).

The challenge module 36 may enable members to define and disseminate challenges. A challenge may include one or more in-game tasks that are specifically defined by a member. By way of non-limiting example, the tasks may include stunts, crashes, races, race results (e.g., finishing place), adversaries, and/or other tasks performed in-game. A challenge may dictate restrictions or self-imposed handicaps that must be employed during performance (e.g., no use of nitrous, using a specific car). The challenge module may enable a member to selectively disseminate a created challenge to one or more specific other members or groups of members, or globally to any members.

As was mentioned above, challenges may be disseminated by a virtual member to a real member, or vice versa. Challenges transmitted from a virtual member to a real member may be impacted by the attitude and/or disposition of the virtual member toward the real member. For example, if the virtual member and the real member are friends, the virtual member may send more and/or easier challenges to the real member. If the virtual member and the real member are rivals, the virtual member may send fewer and/or more difficult challenges to the real member.

The challenge module 36 may track the status of individual members with respect to the challenges they have received and accepted. Tracking the status of individual members with respect to the challenges they have received and accepted may include comparing the in-game activities of individual members with the parameters of their accepted challenges. Upon determining that a member has performed a challenge, the challenge module 34 may generate a notification. The notification may be added to the member page of the member that performed the challenge, and/or disseminated to other members (e.g., the member that created the challenge, other members that have accepted the challenge, friends of the member that performed the challenge). The notification may be disseminated to other members by the communication module 32. The notification disseminated to other real members by member page module 32 may be in the form of communications from virtual members that witnessed and/or have been notified of the performance of the challenge.

The achievement module 38 may be configured to track the achievements of members in the game and/or out of the game. The achievements of members in the game may include game results, and may indicate which of the members has performed "better" within the game. For example, the achievement module 38 may track the finish times at individual race tracks, lap times, top five finishes, wins, crashes, stunts, accumulated points, vehicles owned, number of friends, number of rivals, and/or other activities. The achievement module 38 may establish rankings based on the activities tracked. The rankings may include rankings based on individual activities (e.g., race times at a single track), and/or rankings based on a set of activities. The rankings may be accessible to members via the social network, on a separate website, via a gaming console, and/or other types of real time or near real time communication.

The achievement module 38 may establish rankings for a predetermined set of members. For example, a group of members set up on the social network may have its own rankings for specified activities. The achievement module 38 may establish global rankings that encompass substantially all of the members taking part in the game(s).

The group module 40 may be configured to manage member groups within the social network. Groups may include sets of members that have a dedicated space within the virtual network for posting content and/or communications. These spaces may be private (e.g., only open to members who are a part of the group) or public, or includes separate areas of the space that are private and public. Groups membership in a given group may be reflected in the member pages of the members that are a part of the given group.

Groups may be established by members. In establishing a group, a member may provide a name for the group, set criteria for joining the group, set criteria for remaining a part of the group, and/or otherwise define the group. Criteria for joining and/or remaining a part of the group may include in-game activities (e.g., win a certain race, achieve a certain lap time, crash a specified number of times, and/or other activities), activity within the group (e.g., posting to the group page, issuing challenges to the group, performing challenges issued by the group), ownership of virtual items (e.g., ownership of a certain type of car), and/or other criteria. Groups can be established by real members and by virtual members.

When a group is created, group module 40 may enable a creating player to customize gameplay for players that join the group. For example, group module 40 may enable a customized set of rules to be associated with the group that define gameplay for players that join the group. The customized set of rules may include one or more rules that define a distribution of score, points, experience points, and/or virtual currency to members of the group based on gameplay. Group module 40 may enable the creating member (and/or other members that join the group) to associate a set of race circuits with the group for players that join the group to participate in. This set of race circuits may include one or more race circuits that have been created or customized by the creating member (and/or other members that join the group).

In some groups, in order to become a part of the group a member must receive an invitation. The invitation may be in place of, or in addition to, satisfying the criteria for joining. Upon reception of an invitation, a member may accept an invitation and join the designated group, or reject the invitation. Group invitations may be sent from virtual members to real members, or vice versa.

Actions of real members with respect to groups may impact the relationships of the real members with virtual members. For example, if a real member rejects the invitation of a group, the attitudes and/or dispositions toward the rejecting real member of virtual members that are a part of the group may be negatively impacted. If a virtual member sent the rejected invitation to the real member, the attitude and/or disposition of the virtual member to the real member may be especially negatively impacted. As another example, if a real member invites a virtual member to join a group, the attitude and/or disposition of the virtual member toward the real member may be positively impacted.

Membership and/or status within a group in the social network may be linked with progression through the game. For example, satisfying the criteria required to join a group and/or obtaining an invitation to join the group may unlock content within the game. The new content may include, for instance, a new race, a new locale, new virtual members to compete against, a new level, and/or other game content.

External application input module 41 may enable inputs to be received to the social network from external information sources, such as external applications, external data stores, external web applications and/or other external information sources. This information may be reflected on the social network (e.g., within one or more member pages and/or one or more group spaces). The information received from the external information sources through external application input module 41 may be reflected in the game provided to real players. By way of example, weather reports may be received from an external source (e.g., a weather related website), and the information within the weather report may be reflected in the social network. The updated weather information reflected in the social network may then be implemented by one or more of the modules being executed by the game platform to determine the weather present at one or more events in the game (e.g., at one or more racetracks).

Points and/or status within the game may be achieved through participation in the social network. For example, experience points, virtual currency, and/or other incentives may be provided to real members for posting content to the social network, creating and/or joining groups, filling in profile information, creating friendships, rating content posted by others, and/or other activities on the social network. As such, a real member may begin to accrue points and/or status within the game prior to owning or even playing the actual game.

According to another aspect of the invention, the social network module 30 provides a cross-platform Social Network for one or more game titles with communication across different game platforms, game titles and/or game series. For example, the user profiles can be used with the same game title across multiple platforms, within a series of games, across game series and/or with different game titles. This may produce loyalty among users to the game titles and/or platforms that are supported by the social network. Users that build their profiles, and/or a mass rewards, status, points and/or virtual currency via games that are supported by the social network may be hesitant to migrate to new game titles outside of the social network where they may have to "start fresh."

System 10 can use the social network provided by social network module 30 to preview, in a variety of ways, enhancements, sequels, new game titles in a series and/or other game titles or content. By way of example, system 10 may provide content about the new offering (e.g, to provide a preview or trailer video to deliver a 'coming soon' message into the player's news feed, that could show them a video trailer of the new offering). As another example, the system can use virtual member messages (e.g., a virtual member can send one or more player messages about upcoming features in the new offering). As another example, the system can send screenshots of the new offering (e.g, a virtual member can send a player screenshots of new content in the new offering), preview parts of new version for free in current version (trailer, video virtual member messages, screen shots, etc.), and/or provide new content to players in other ways.

Characters in an upcoming game may be introduced as new virtual members to the social network. The new virtual members may create new relationships with real member through member messages, joining groups, accepting challenges and/or friendships, starting new groups, issuing new challenges, and/or other interactions on the social network. In some instances, previously existing virtual members may suddenly become less prevalent in existing games, as they "visit" the content of an upcoming game. They may report back the real members of the social network about the upcoming content through member page postings, member messages, and/or other types of interactions.

The social network may be leveraged to obtain user feedback concerning upcoming content and/or games. Content postings, member messages, and/or other interactions of virtual members conveying information about upcoming content may be monitored to gauge the reaction of real members on the social network. These reactions may be used to make decisions about the design and/or execution of the yet to be released game content.

A player that has played previous game titles supported by the social network may enter a new game release with the status, relationships, equipment, and/or skills that he has acquired through game play in previous releases and/or involvement in the social network. As such, as new games become public, and are supported by the social network of system 10, previous involvement in the social network may encourage users to adopt the new releases. For example, players that have spent time playing the previous releases and building their profiles on the social network may be motivated to participate in the new releases to maintain their membership in groups on the social network with game play requirements for membership, to gain access to new user groups, to perform and/or design challenges in the new releases, to interact in game with friends and rivals that are participating in the new releases, and/or for other social reasons. As such, the social network builds brand loyalty amongst users by leveraging the time and energy that users have previously spent building their characters and the status of the characters within the context of the games.

The social network may support the development of third-party applications that are usable with the social network. The third-party applications may be subject to review by the provider of the social network.

System 10 may provide opportunities for enhanced targeted in-game sponsorship and/or advertising. For example, rather than only selling advertisement space within the game, advertising space may be sold in the social network. This may include banner ads in views of the social network. Further, demographic information, consumer preferences, and/or other information entered by users into the social network may be implemented to generated targeted advertising opportunities in the game and/or via the social network. For example, individual user information, group information, friendship information, communications between members, and/or other information from the social network may provide for targeted advertising opportunities. In some implementations, virtual members may endorse products or services. These endorsements may include virtual product usage (e.g., fastest virtual member drives a certain type of car), express statements in game, express statements in the social network, and/or other types of endorsements.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A computer program stored in a memory and adapted to be at least partially executed in one game platform of multiple different game platforms, wherein the computer program comprises
 a game module configured to be executed by the game platform and, when executed, to generate visual and audio stimuli to provide a player with a game experience; and
 a virtual member module, wherein the virtual member module is configured to control interactions of a virtual member with said player within a social network, wherein the social network is accessible outside the game experience and wherein the social network is a multi-node communication tool for providing a unitary forum only accessible to users of said multiple game platforms.

2. The computer program of claim 1 wherein the virtual member module comprises a first module configured to determine at least one of an attitude and a disposition of said virtual member to said player.

3. The computer program of claim 2 wherein the first module is configured to track interactions between the player and another player and to determine at least one of said attitude and disposition of the virtual member toward the player based on a degree of friendliness or enmity of said interactions.

4. The computer program of claim 2 wherein the first module assigns a disposition mode to a relationship between the virtual member and the player and wherein said disposition mode is at least one of friend, rival and neutral.

5. The computer program of claim 2 wherein the first module is configured to convey a status of a relationship between the virtual member and the player through at least one of an audio indicator within the game experience, a visual indicator within the game experience, an audio indicator within the social network, and a visual indicator within the social network.

6. The computer program of claim 2 wherein the first module is configured to change a plurality of behaviors of said virtual member toward said player based upon an assigned disposition mode and a predetermined profile of said virtual member.

7. The computer program of claim 6 wherein said plurality of behaviors comprise at least one of sending invitations in said social network to join groups in said social network, accepting invitations in said social network to join groups in said social network, posting encouraging, positive, or helpful messages to member pages in said social network, and posting discouraging, negative, or derisive messages to member pages in said social network.

8. The computer program of claim 6 wherein the virtual member module comprises a second module and wherein the second module alters a manner in which the virtual member interacts with the player in the social network based on said at least one of the plurality of behaviors of said virtual member toward said player.

9. The computer program of claim 2 wherein the virtual member module comprises a second module and wherein the second module alters a manner in which the virtual member interacts with the player in the social network based on said at least one of an attitude and a disposition of said virtual member to said player.

10. The computer program of claim 1 wherein the virtual member module is configured to modify interactions between the virtual member and the player within the game experience based upon interactions within the social network.

11. The computer program of claim 10 wherein said interactions within the social network comprise at least one of postings to member pages within the social network and responses to postings to member pages within the social network.

12. The computer program of claim 1 wherein the virtual member module is configured to increase aggressive behavior by the virtual member to the player in the game experience based upon at least one of challenging postings by the player in the social network, hostile postings by the player in the social network, challenging responses by the player in the social network, and hostile responses by the player in the social network.

13. The computer program of claim 1 wherein the virtual member module is configured to modify interactions between the virtual member and the player within the social network based upon interactions within the game experience.

14. The computer program of claim 1 wherein the virtual member module is configured to have an effect on a relationship between the virtual member and the player based on other relationships of the player within the social network.

15. The computer program of claim 14 wherein, if the virtual member and the player are both friends of another virtual member or another player within the social network, the virtual member module is configured to assign at least one of a positive attitude and positive disposition between the virtual member and the player in the game experience.

16. The computer program of claim 14 wherein, if the virtual member and the player are both friends of another virtual member or another player within the social network, the virtual member module is configured to assign at least one of a positive attitude and positive disposition between the virtual member and the player in the game experience.

17. The computer program of claim 1 wherein the virtual member module is configured to provide guidance to the player within the game experience based on said interactions of the virtual member with the player within the social network.

18. The computer program of claim 1 wherein the virtual member module is configured to generate a negative attitude by the virtual member toward the player in the game experience based upon a rejection by the player of an invitation from the virtual member.

19. The computer program of claim 1 wherein the computer program is configured to unlock content within the game experience based upon interactions by the player in the social network.

20. The computer program of claim 1 wherein the virtual member module is configured to cause a message to be sent from the virtual member to the player within the social network based upon an action by the player in the game experience.

21. The computer program of claim 1 wherein said multi-node communication tool is configured to communicate results, invites, challenges, events, or new features of games in a form of email, text, chat, in-game communication or exportation to a website via one or more communication devices.

* * * * *